(12) United States Patent
Huang et al.

(10) Patent No.: US 9,552,171 B2
(45) Date of Patent: Jan. 24, 2017

(54) READ SCRUB WITH ADAPTIVE COUNTER MANAGEMENT

(71) Applicant: SanDisk Technologies LLC, Plano, TX (US)

(72) Inventors: Yichao Huang, San Jose, CA (US); Chris Avila, Saratoga, CA (US); Dana Lee, Saratoga, CA (US); Henry Chin, Fremont, CA (US); Deepanshu Dutta, San Jose, CA (US); Sarath Puthenthermadam, San Jose, CA (US); Deepak Raghu, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 146 days.

(21) Appl. No.: 14/526,870

(22) Filed: Oct. 29, 2014

(65) Prior Publication Data

US 2016/0124679 A1    May 5, 2016

(51) Int. Cl.
     *G06F 12/00*     (2006.01)
     *G06F 3/06*      (2006.01)
     (Continued)

(52) U.S. Cl.
     CPC ........... *G06F 3/0647* (2013.01); *G06F 3/0608* (2013.01); *G06F 3/0679* (2013.01);
     (Continued)

(58) Field of Classification Search
     CPC .. G06F 3/0647; G06F 12/0223; G06F 3/0679; G06F 3/0608; G06F 2212/7205; G11C 16/0483; G11C 16/349; G11C 16/3495; G11C 2211/5648; G11C 2211/5644
     See application file for complete search history.

(56) References Cited

U.S. PATENT DOCUMENTS

| 4,139,911 A | 2/1979 | Sciulli et al. |
| 4,218,764 A | 8/1980 | Furuta et al. |

(Continued)

FOREIGN PATENT DOCUMENTS

| EP | 97460009.0 | 2/1997 |
| EP | 0791933 | 8/1997 |

(Continued)

OTHER PUBLICATIONS

International Search Report and Written Opinion in International Patent Application No. PCT/US2015/050212. Mailed Mar. 14, 2016. 17 pages.

(Continued)

*Primary Examiner* — John A Lane
(74) *Attorney, Agent, or Firm* — Stoel Rives LLP

(57) ABSTRACT

A number of complimentary techniques for the read scrub process using adaptive counter management are presented. In one set of techniques, in addition to maintaining a cumulative read counter for a block, a boundary word line counter can also be maintained to track the number of reads to most recently written word line or word lines of a partially written block. Another set of techniques used read count threshold values that vary with the number of program/erase cycles that a block has undergone. Further techniques involve setting the read count threshold for a closed (fully written) block based upon the number reads it experienced prior to being closed. These techniques can also be applied at a sub-block, zone level.

20 Claims, 14 Drawing Sheets

(51) Int. Cl.
*G06F 12/02* (2006.01)
*G11C 16/04* (2006.01)
*G11C 16/34* (2006.01)

(52) U.S. Cl.
CPC ...... *G06F 12/0223* (2013.01); *G11C 16/0483* (2013.01); *G11C 16/349* (2013.01); *G11C 16/3431* (2013.01); *G11C 16/3495* (2013.01); *G06F 2212/7205* (2013.01); *G11C 2211/5644* (2013.01); *G11C 2211/5648* (2013.01)

(56) References Cited

U.S. PATENT DOCUMENTS

| | | | |
|---|---|---|---|
| 4,253,059 A | 2/1981 | Bell et al. | |
| 4,460,982 A | 7/1984 | Gee et al. | |
| 4,612,630 A | 9/1986 | Rosier | |
| 4,694,454 A | 9/1987 | Matsuura | |
| 4,703,196 A | 10/1987 | Arakawa | |
| 4,703,453 A | 10/1987 | Shinoda et al. | |
| 4,733,394 A | 3/1988 | Giebel | |
| 4,763,305 A | 8/1988 | Kuo | |
| 4,779,272 A | 10/1988 | Kohda et al. | |
| 4,799,195 A | 1/1989 | Iwahashi et al. | |
| 4,809,231 A | 2/1989 | Shannon et al. | |
| 4,827,450 A | 5/1989 | Kowalski | |
| 4,937,787 A | 6/1990 | Kobatake | |
| 4,962,322 A | 10/1990 | Chapman | |
| 4,964,079 A | 10/1990 | Devin | |
| 4,975,883 A | 12/1990 | Baker et al. | |
| 4,980,859 A | 12/1990 | Guterman et al. | |
| 5,043,940 A | 8/1991 | Harari | |
| 5,052,002 A | 9/1991 | Tanagawa | |
| 5,065,364 A | 11/1991 | Atwood et al. | |
| 5,070,032 A | 12/1991 | Yuan et al. | |
| 5,095,344 A | 3/1992 | Harari | |
| 5,119,330 A | 6/1992 | Tanagawa | |
| 5,122,985 A | 6/1992 | Santin | |
| 5,132,928 A | 7/1992 | Hayashikoshi et al. | |
| 5,132,935 A | 7/1992 | Ashmore, Jr. | |
| 5,151,906 A | 9/1992 | Sawada | |
| 5,157,629 A | 10/1992 | Sato et al. | |
| 5,172,338 A | 12/1992 | Mehrotra et al. | |
| 5,172,339 A | 12/1992 | Noguchi et al. | |
| 5,200,922 A | 4/1993 | Rao | |
| 5,200,959 A | 4/1993 | Gross et al. | |
| 5,239,505 A | 8/1993 | Fazio et al. | |
| 5,262,984 A | 11/1993 | Noguchi et al. | |
| 5,263,032 A | 11/1993 | Porter et al. | |
| 5,270,551 A | 12/1993 | Kamimura et al. | |
| 5,270,979 A | 12/1993 | Harari et al. | |
| 5,278,794 A | 1/1994 | Tanaka et al. | |
| 5,313,421 A | 5/1994 | Guterman et al. | |
| 5,313,427 A | 5/1994 | Schreck et al. | |
| 5,315,541 A | 5/1994 | Harari et al. | |
| 5,321,655 A | 6/1994 | Iwahashi et al. | |
| 5,327,383 A | 7/1994 | Merchant et al. | |
| 5,335,198 A | 8/1994 | Van Buskirk et al. | |
| 5,341,334 A | 8/1994 | Maruyama | |
| 5,343,063 A | 8/1994 | Yuan et al. | |
| 5,347,489 A | 9/1994 | Mechant et al. | |
| 5,365,486 A | 11/1994 | Schreck | |
| 5,377,147 A | 12/1994 | Merchant et al. | |
| 5,394,359 A | 2/1995 | Kowalski | |
| 5,404,485 A | 4/1995 | Ban | |
| 5,450,363 A | 9/1995 | Christopherson et al. | |
| 5,465,236 A | 11/1995 | Naruke | |
| 5,475,693 A | 12/1995 | Christopherson et al. | |
| 5,504,760 A | 4/1996 | Harari et al. | |
| 5,523,972 A | 6/1996 | Rashid et al. | |
| 5,530,705 A | 6/1996 | Malone, Sr. | |
| 5,532,962 A | 7/1996 | Auclair et al. | |
| 5,570,315 A | 10/1996 | Tanaka et al. | |
| 5,583,812 A | 12/1996 | Harari | |
| 5,621,682 A | 4/1997 | Tanzawa et al. | |
| 5,648,934 A | 7/1997 | O'Toole | |
| 5,652,720 A | 7/1997 | Aulas et al. | |
| 5,657,332 A | 8/1997 | Auclair et al. | |
| 5,661,053 A | 8/1997 | Yuan | |
| 5,675,537 A | 10/1997 | Bill et al. | |
| 5,689,465 A | 11/1997 | Sukegawa et al. | |
| 5,699,297 A | 12/1997 | Yamazaki et al. | |
| 5,703,506 A | 12/1997 | Shook et al. | |
| 5,712,815 A | 1/1998 | Bill et al. | |
| 5,715,193 A | 2/1998 | Norman | |
| 5,717,632 A | 2/1998 | Richart et al. | |
| 5,751,639 A | 5/1998 | Ohsawa | |
| 5,761,125 A | 6/1998 | Himeno | |
| 5,774,397 A | 6/1998 | Endoh et al. | |
| 5,798,968 A | 8/1998 | Lee et al. | |
| 5,835,413 A | 11/1998 | Hurter et al. | |
| 5,889,698 A | 3/1999 | Miwa et al. | |
| 5,890,192 A | 3/1999 | Lee et al. | |
| 5,905,673 A | 5/1999 | Khan | |
| 5,909,449 A | 6/1999 | So et al. | |
| 5,930,167 A | 7/1999 | Lee et al. | |
| 5,937,425 A | 8/1999 | Ban | |
| 5,963,473 A | 10/1999 | Norman | |
| 6,046,935 A | 4/2000 | Takeuchi et al. | |
| 6,145,051 A | 11/2000 | Estakhri et al. | |
| 6,151,246 A | 11/2000 | So et al. | |
| 6,199,139 B1 | 3/2001 | Katayama et al. | |
| 6,215,697 B1 | 4/2001 | Lu et al. | |
| 6,222,762 B1 | 4/2001 | Guterman et al. | |
| 6,222,768 B1 | 4/2001 | Hollmer et al. | |
| 6,339,546 B1 | 1/2002 | Katayama et al. | |
| 6,345,001 B1 | 2/2002 | Mokhlesi | |
| 6,415,352 B1 | 7/2002 | Asami et al. | |
| 6,426,893 B1 | 7/2002 | Conley et al. | |
| 6,456,528 B1 | 9/2002 | Chen | |
| 6,522,580 B2 | 2/2003 | Chen | |
| 6,560,152 B1 | 5/2003 | Cernea | |
| 6,567,307 B1 | 5/2003 | Estakhri | |
| 6,678,785 B2 | 1/2004 | Lasser | |
| 6,728,134 B2 | 4/2004 | Ooishi | |
| 6,760,255 B2 | 7/2004 | Conley et al. | |
| 6,763,424 B2 | 7/2004 | Conley | |
| 6,772,274 B1 | 8/2004 | Estakhri | |
| 6,807,101 B2 | 10/2004 | Ooishi et al. | |
| 6,839,281 B2 | 1/2005 | Chen et al. | |
| 6,912,160 B2 | 6/2005 | Yamada | |
| 6,925,007 B2 | 8/2005 | Harari et al. | |
| 6,963,505 B2 | 11/2005 | Cohen | |
| 7,012,835 B2 | 3/2006 | Gonzalez et al. | |
| 7,076,598 B2 | 7/2006 | Wang | |
| 7,224,607 B2 | 5/2007 | Gonzalez et al. | |
| 7,224,611 B2 | 5/2007 | Yamamoto et al. | |
| 7,242,618 B2 | 7/2007 | Shappir et al. | |
| 7,254,071 B2 | 8/2007 | Tu et al. | |
| 7,257,025 B2 | 8/2007 | Maayan et al. | |
| 7,286,412 B1 | 10/2007 | Chen | |
| 7,330,376 B1 | 2/2008 | Chen et al. | |
| 7,450,425 B2 | 11/2008 | Aritome | |
| 7,489,549 B2 | 2/2009 | Mokhlesi | |
| 7,518,919 B2 | 4/2009 | Gonzalez et al. | |
| 7,613,043 B2 | 11/2009 | Cornwell et al. | |
| 7,630,254 B2 | 12/2009 | Lutze | |
| 7,631,245 B2 | 12/2009 | Lasser | |
| 7,716,538 B2 | 5/2010 | Gonzalez et al. | |
| 7,835,209 B2 | 11/2010 | Park et al. | |
| 7,843,727 B2 | 11/2010 | Cho et al. | |
| 8,014,201 B2 | 9/2011 | Park | |
| 8,259,506 B1 | 9/2012 | Sommer et al. | |
| 8,874,993 B2 * | 10/2014 | Eleftheriou | G06F 11/1068 714/42 |
| 2002/0048202 A1 | 4/2002 | Higuchi | |
| 2003/0086293 A1 | 5/2003 | Gongwer et al. | |
| 2003/0109093 A1 | 6/2003 | Harari et al. | |
| 2005/0073884 A1 | 4/2005 | Gonzalez et al. | |
| 2005/0231999 A1 | 10/2005 | Moriyama | |
| 2006/0039196 A1 | 2/2006 | Gorobets et al. | |
| 2006/0062048 A1 | 3/2006 | Gonzalez et al. | |
| 2006/0233023 A1 | 10/2006 | Lin et al. | |
| 2007/0174740 A1 | 7/2007 | Kanno | |
| 2007/0211532 A1 | 9/2007 | Gonzalez et al. | |

(56) References Cited

U.S. PATENT DOCUMENTS

| | | |
|---|---|---|
| 2007/0279989 A1 | 12/2007 | Aritome |
| 2008/0071511 A1 | 3/2008 | Lin |
| 2008/0123420 A1 | 5/2008 | Brandman et al. |
| 2008/0158968 A1 | 7/2008 | Moogat et al. |
| 2008/0158969 A1 | 7/2008 | Moogat et al. |
| 2008/0259708 A1 | 10/2008 | Tsukazaki et al. |
| 2009/0003058 A1 | 1/2009 | Kang |
| 2009/0172254 A1 | 7/2009 | Chen |
| 2009/0187785 A1 | 7/2009 | Gonzalez et al. |
| 2013/0055046 A1 | 2/2013 | Blodgett |

FOREIGN PATENT DOCUMENTS

| | | |
|---|---|---|
| GB | 2289779 | 11/1995 |
| JP | 8-077785 | 3/1996 |
| JP | 8-147988 | 6/1996 |
| JP | 8-279295 | 10/1996 |
| JP | 8-297987 | 11/1996 |
| JP | 09-128165 | 5/1997 |
| JP | 9-306182 | 11/1997 |
| JP | 2000-187992 | 7/2000 |
| JP | 2002-318729 | 10/2002 |
| JP | 2003-058432 | 2/2003 |
| KR | 20140075396 A | 6/2014 |
| WO | WO 9012400 | 10/1990 |
| WO | WO 01/08015 | 2/2001 |
| WO | WO 01/22232 | 3/2001 |
| WO | WO 02/058074 | 7/2002 |
| WO | WO2005/036401 | 4/2005 |
| WO | WO2005/041107 | 5/2005 |
| WO | WO 2011/024015 | 3/2011 |

OTHER PUBLICATIONS

Lee et al., "Error Correction Technique for Multivalued MOS Memory," *Electronic Letters*, vol. 27, No. 15, Jul. 18, 1991, pp. 1321-1323.

* cited by examiner

READ SCRUB WITH ADAPTIVE COUNTER MANAGEMENT

BACKGROUND

The following relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

SUMMARY

A method is presented for operating a non-volatile memory circuit having a plurality of blocks formed according to a NAND type architecture in which memory cells of a block are formed along a plurality of word lines, and in which the word lines of a block are written in sequence from a first end to a second end of the block. The method includes maintaining, for blocks in which one or more but less than all of the word lines have been written, first and second read counts. The first read count tracks the cumulative number of reads for all word lines of the corresponding block and the second read count tracks the cumulative number of reads to one or more of the last word lines in the write sequence of the corresponding block that is written at the time at which the read is performed. The first and second read counts are reset after an erase operation to the corresponding block. In response to either of the first or second read counts of a block reaching a respective first or second count threshold, the corresponding block is marked for a data relocation operation.

A method is also presented for operating a non-volatile memory circuit having a plurality of blocks in which memory cells of a block are formed along a plurality of word lines. The method includes maintaining for each of the blocks an experience count tracking the number program-erase cycles that the block has undergone and maintaining for each of the blocks a first read count tracking the cumulative number of reads for all word lines of the block since the block was last erased. In response to incrementing one of the first read counts, a comparison is performed of the incremented first read count to one of a plurality of first read count thresholds, wherein the first read count threshold used for the comparison is dependent upon the experience count of the corresponding block. In response to the incremented first read count reaching the used first read count threshold, the corresponding block is marked for a data relocation operation.

A further method is presented for operating a rewritable non-volatile memory circuit formed of a plurality of blocks each having multiple memory cells. For partially written blocks a corresponding first read count is maintained, where the first read count tracks the cumulative number of reads of the corresponding block, and where the first read count is reset after an erase operation to the corresponding block. In response to a previously partially written block becoming fully written: a corresponding closed block threshold for the block is determined, wherein the corresponding closed block threshold is dependent upon the value of the corresponding first read count at the time at which the block becomes fully written; the corresponding first read count is reset, where the first read count subsequently tracks the cumulative number of the number of reads to the corresponding block; and in response to the first read count of the corresponding block reaching the corresponding closed block threshold, the block is marked for a data relocation operation.

Yet another method relates to operating a non-volatile memory circuit having a plurality of blocks formed according to a NAND type architecture in which memory cells of a block are formed along a plurality of word lines. The word lines of a block are written in sequence from a first end to a second end of the block. A plurality of first read counts are maintained, where each of the first read count tracks the cumulative number of reads to a corresponding subset of word lines of the corresponding block, and where each of the subsets is a plurality of adjacent word lines. The first read counts are reset after an erase operation to the corresponding block. In response to any of the first read counts of a block reaching a respective one of a plurality of first thresholds, the corresponding block is marked for a data relocation operation.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
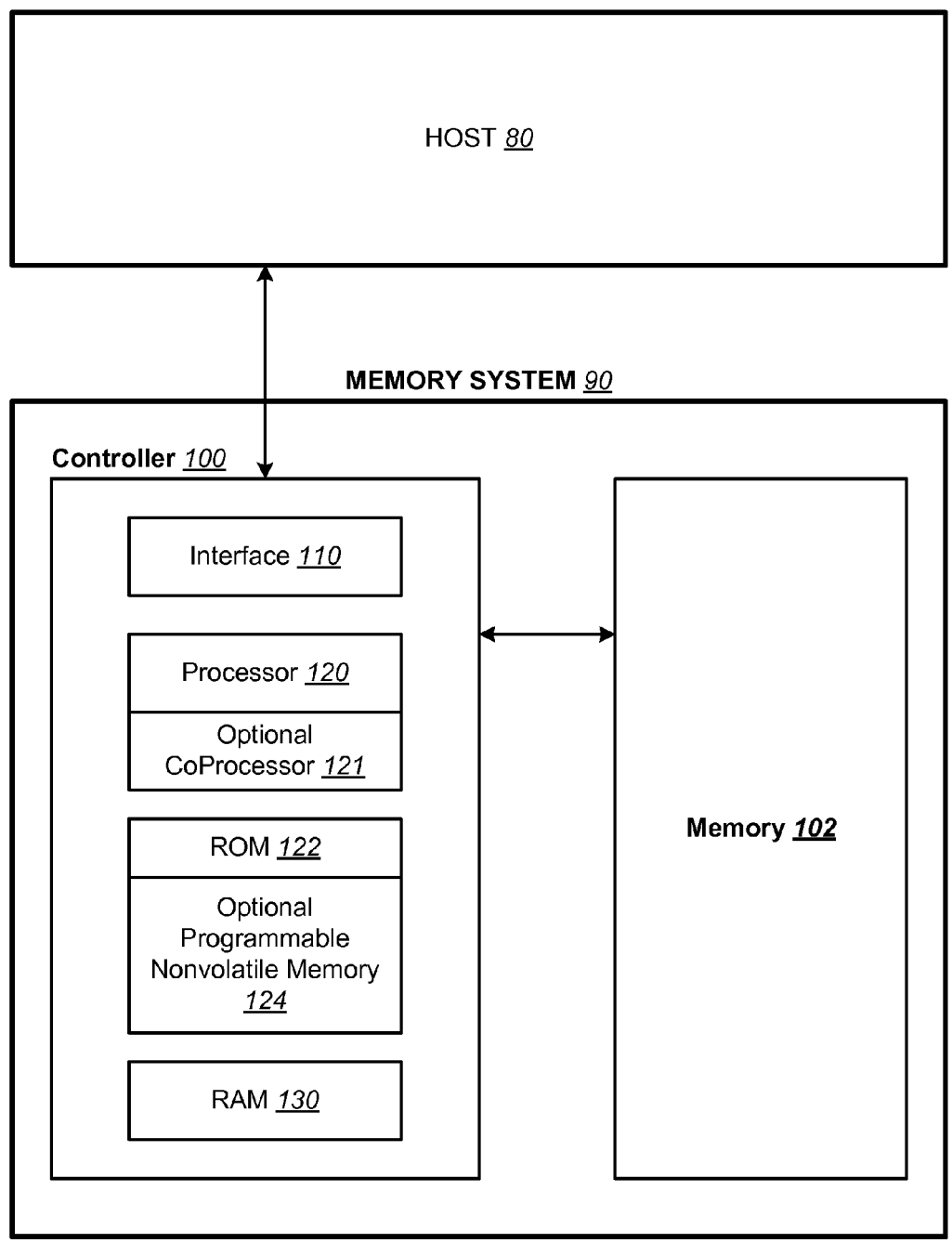
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
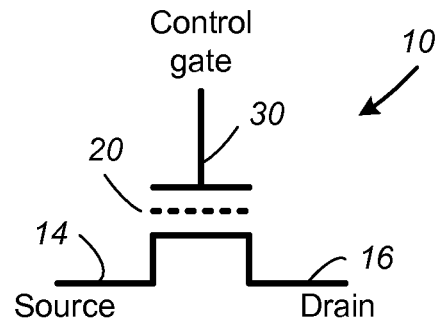
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
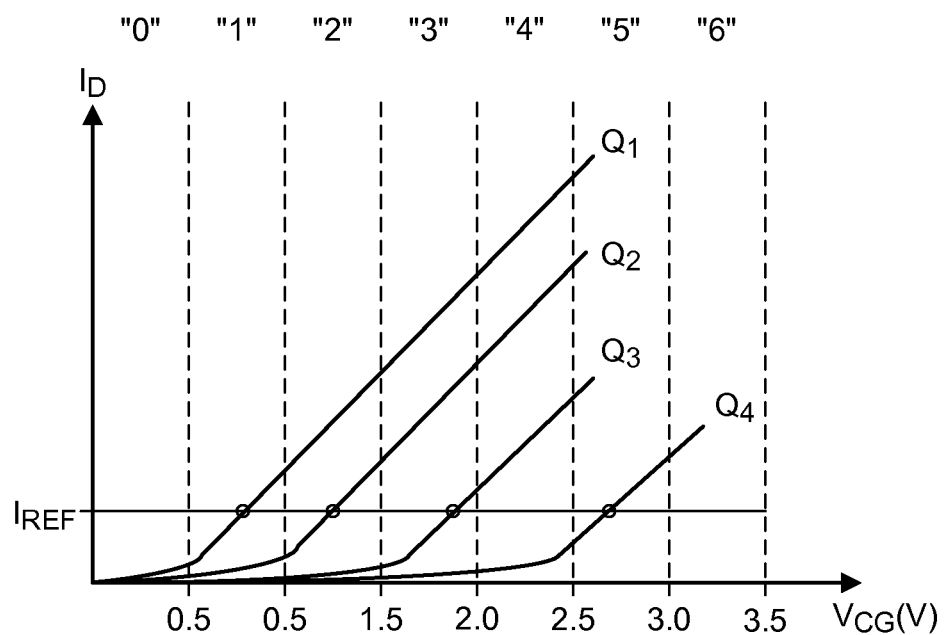
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
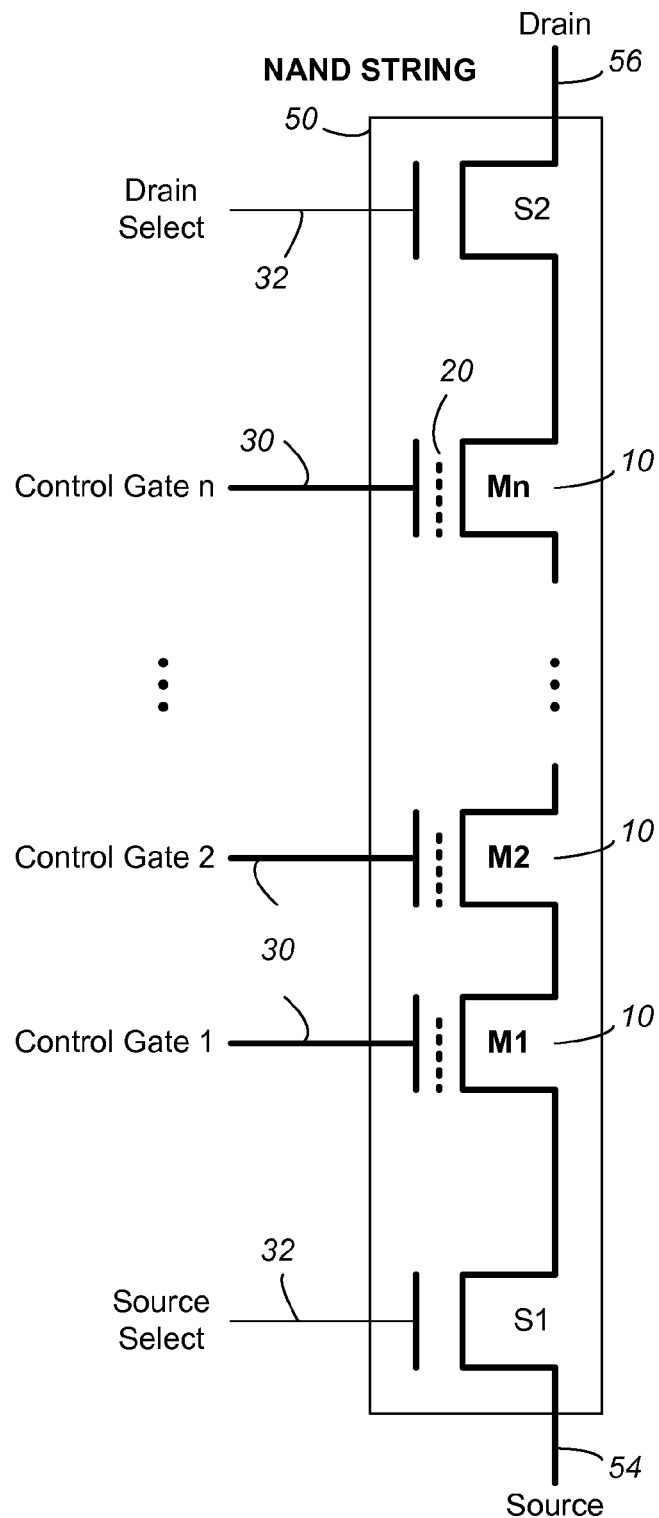
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

FIG. 4B illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
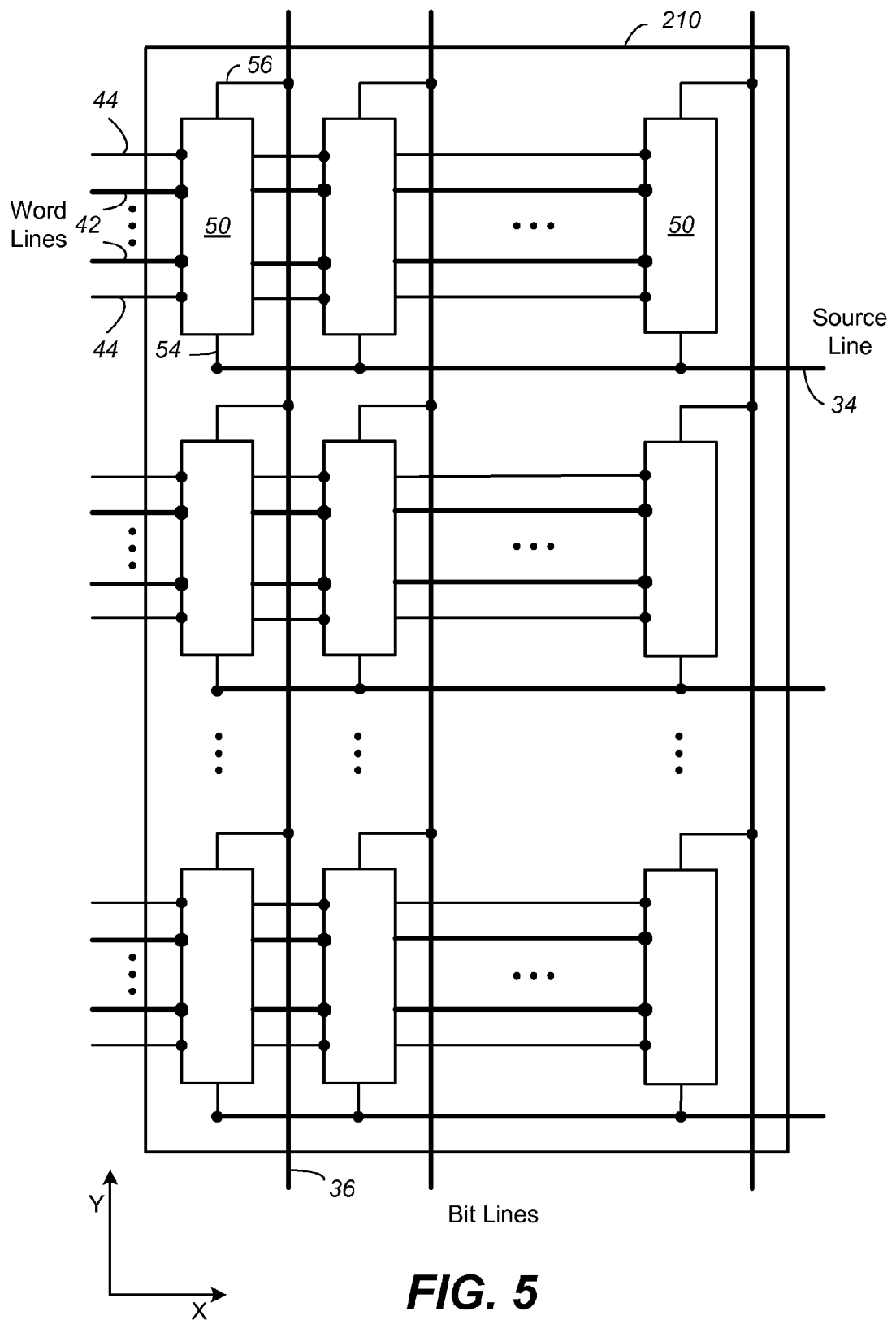
FIG. 5 illustrates an example of a NAND array 210 of memory cells, constituted from NAND strings 50 such as that shown in FIG. 4.
Figure 6:
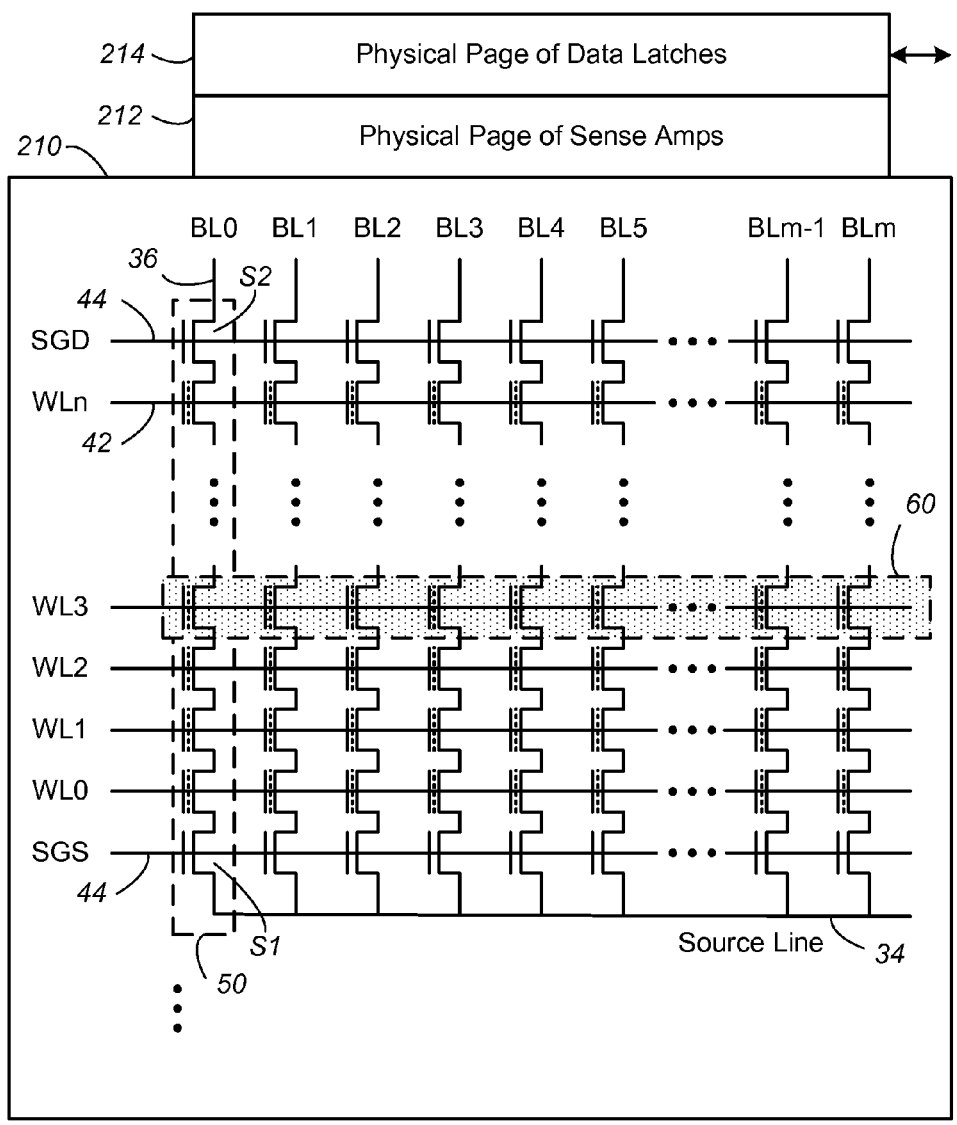
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
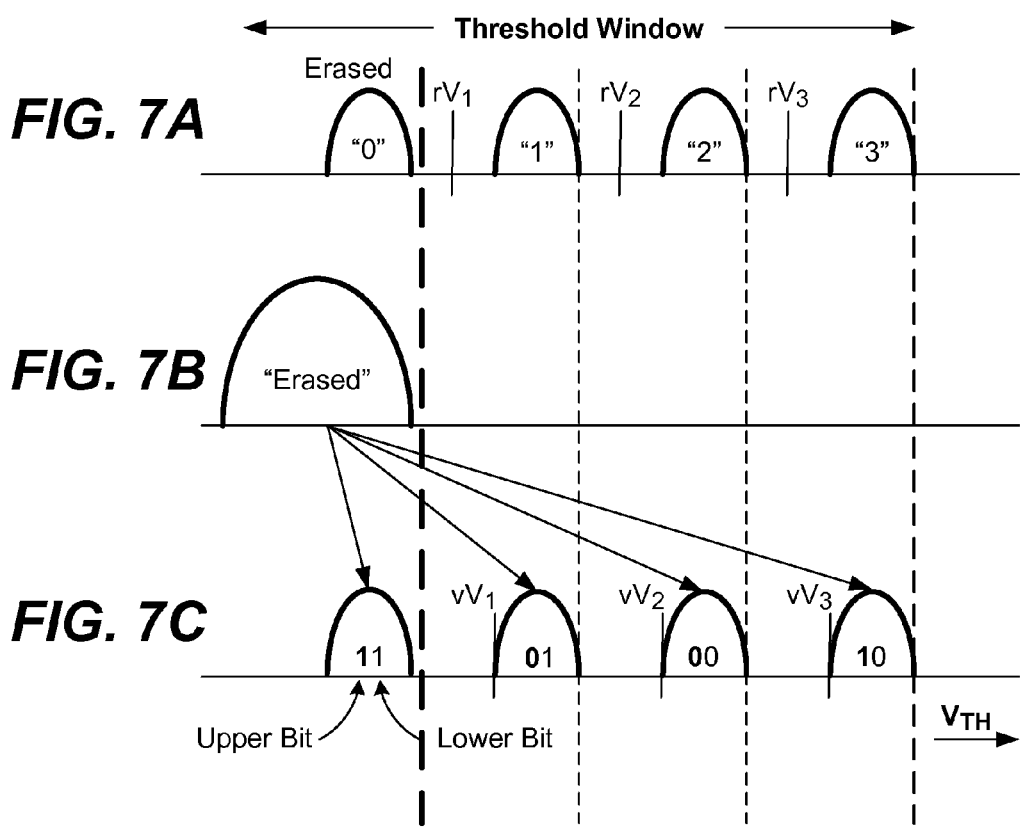
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
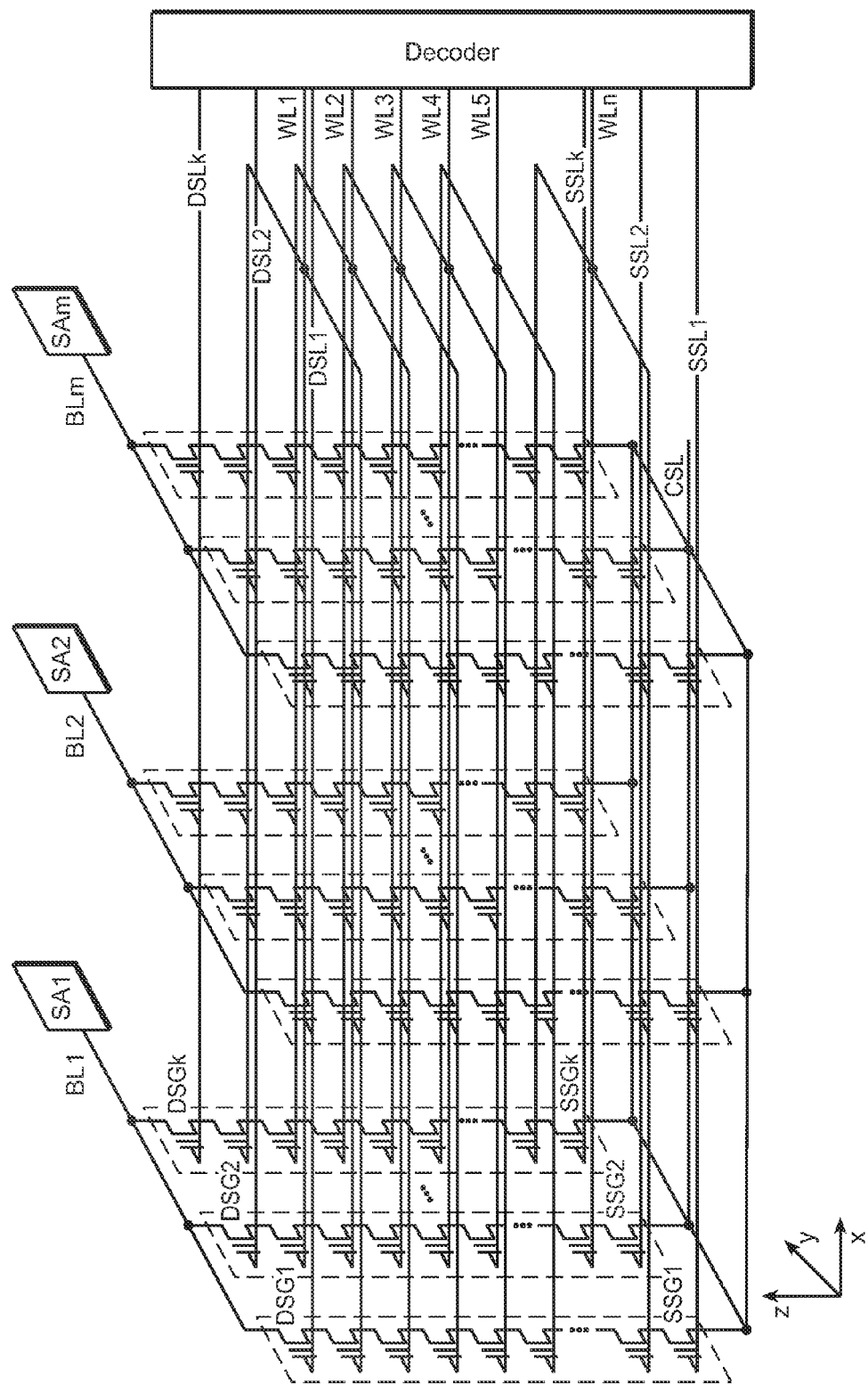
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-*m*, each run across the top to an associated sense amp SA1-*m*. The word lines, WL1-*n*, and source and select lines SSL1-*n* and DSL1-*n*, then run in x direction, with the NAND string connected at bottom to a common source line CSL.

Figure 9:
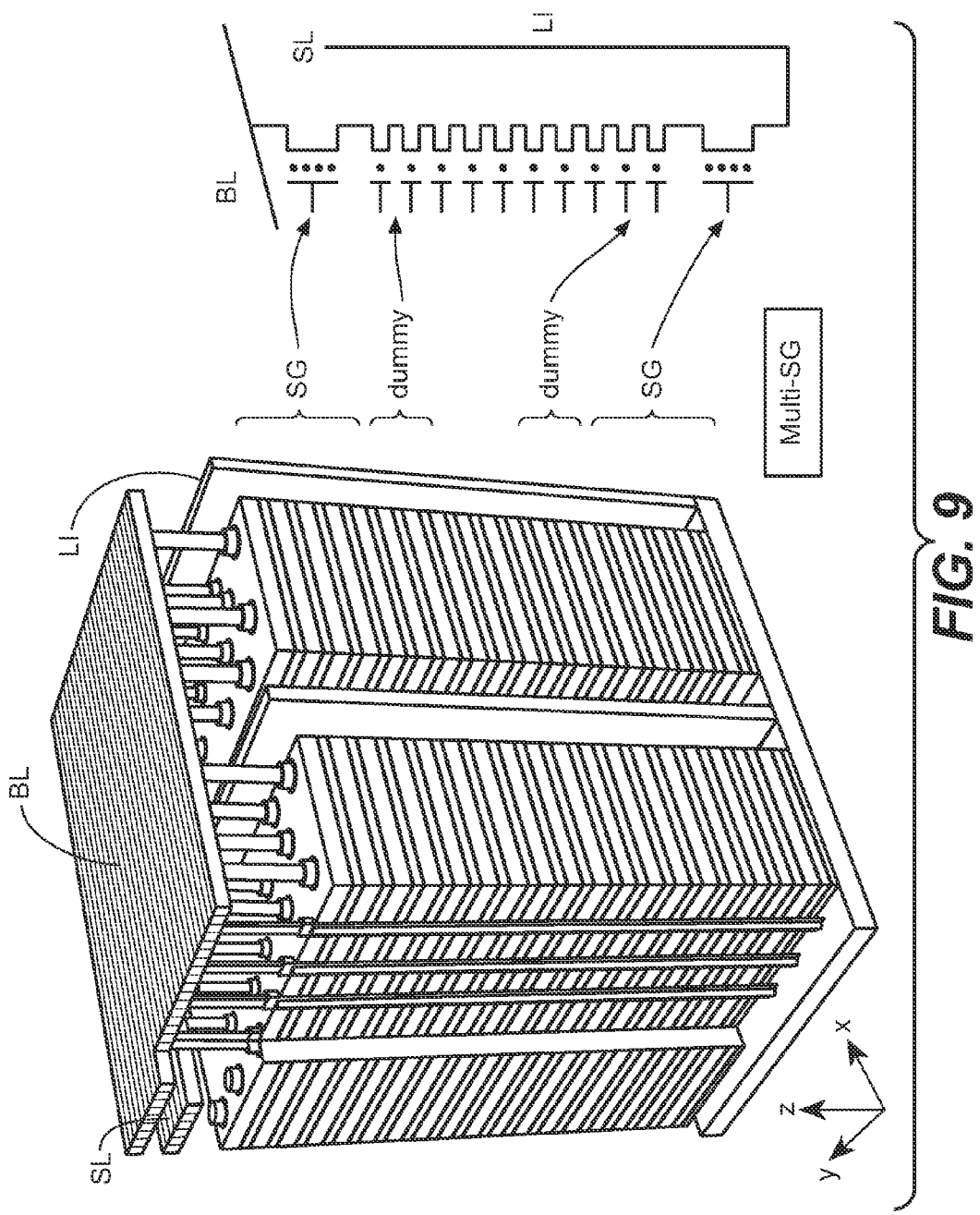
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
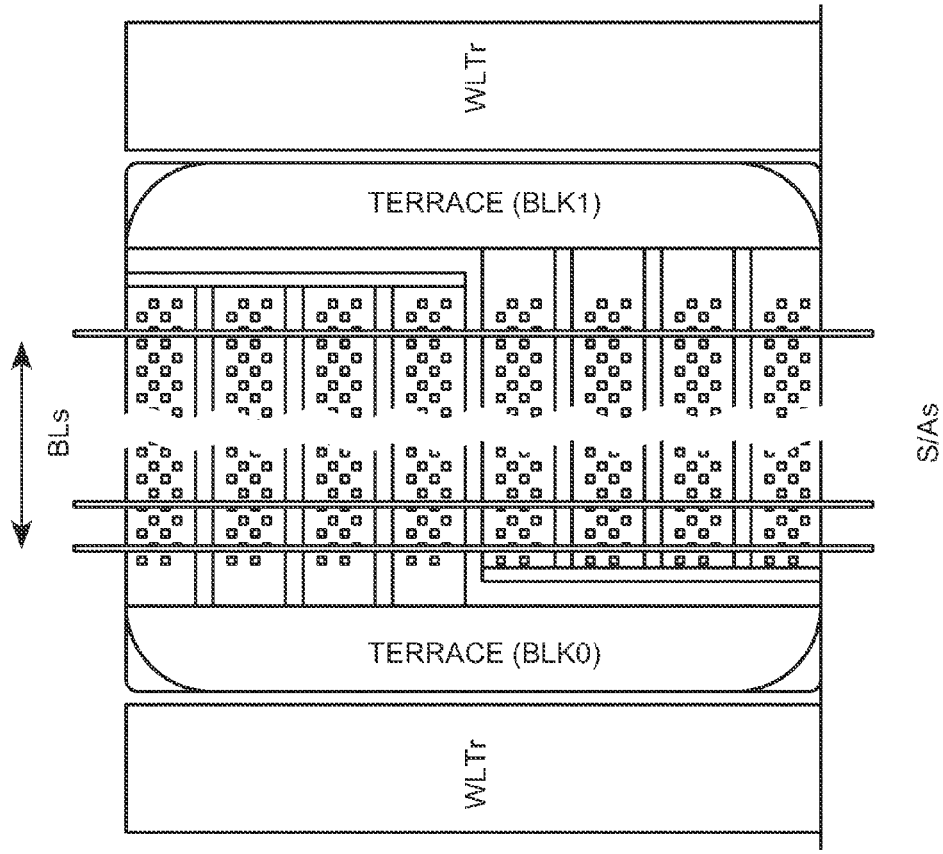

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
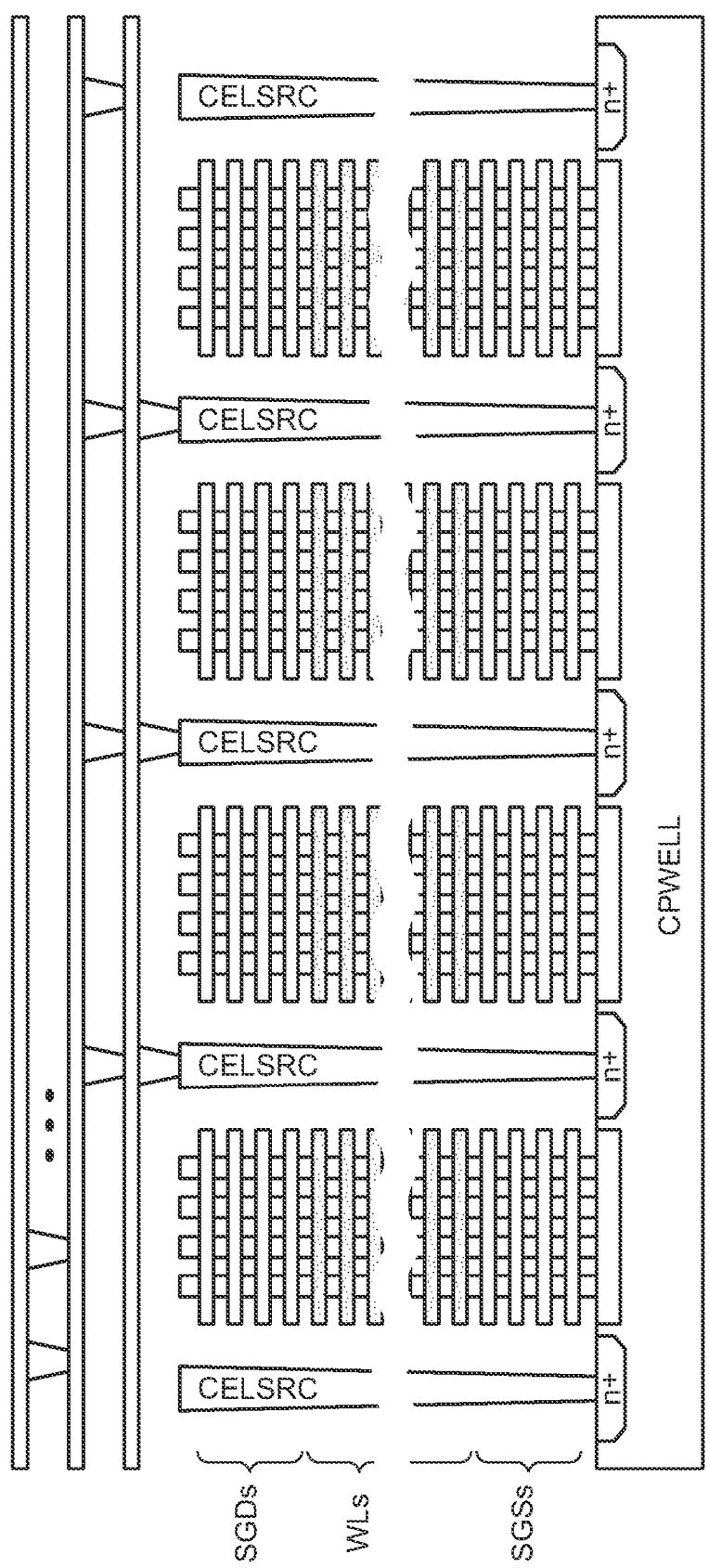

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
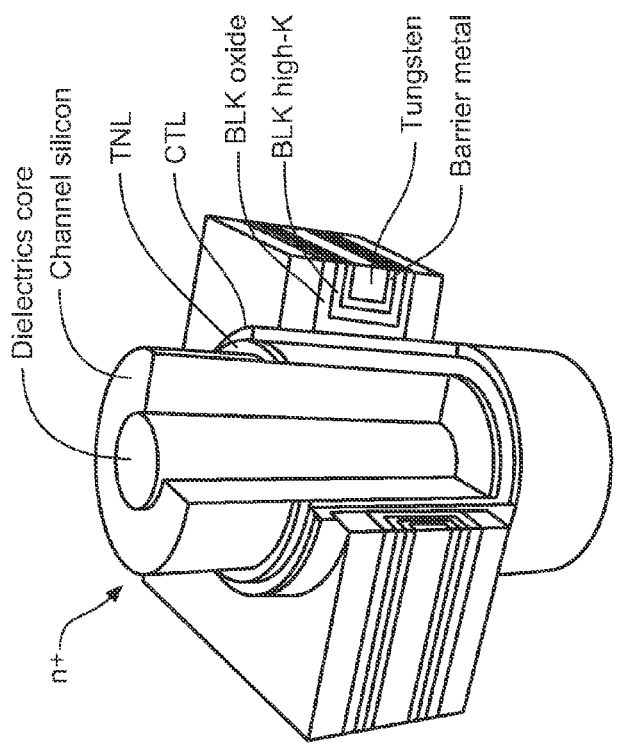

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Read Scrub with Adaptive Counter Management

Performing an operation, such as a read, write or erase, on one location of a memory like those described above can affect the quality of data stored on another location of the memory, an effect called a "disturb". For example, due to capacitive coupling between memory cells on adjacent word line (or "Yupin-effect"), a voltage applied along one word line can affect the state of the memory cells on adjacent word lines. In the case of NAND memory, whether of the 2D or 3D variety, when reading a selected word line, non-selected word lines along shared NAND strings must also be biased. Referring back to FIG. 6, to read memory cells along WL3 requires that the cells along the other word lines must basically be removed from the sensing process. This is done by applying a voltage VREAD to all non-selected word lines (WL0-2 and WL4-$n$ in this example) that is high enough so that non-selected memory cells on these word lines conduct regardless of the data state they hold. For example, for the states illustrated in FIGS. 7A-C, VREAD needs to be higher than the threshold voltages of the highest state's distribution. The cells on these non-selected word lines will then conduct and the cells along selected word lines can then be read by applying a sensing voltage VCG_R (such as one of the sensing voltages, such as $rV_1$, $rV_2$, or $rV_3$ in FIG. 7A) along the selected WL3. The application of this relatively high VPASS level can be a particular cause of read disturb, particularly for erased memory cells.

This section looks at some techniques for reducing the impact of read disturbance and data retention by tracking the amount of read stress to word lines in a block with adaptive zone counters (e.g., by adapting to the condition while the block is open or closed, adapting to different stages of device life, etc). After the counters reach thresholds (which can be pre-defined as suggested by a device read disturb specification), the data in the block will be relocated to maintain data integrity and increase the overall read endurance of a memory system.

There are a number of approaches for dealing with this problem, such as a block-based approach of a read scrub algorithm. Under this arrangement, the memory system keeps one counter for each block. Each read applied to the block will result in the increment of the counter once, triggering a block copy if the count exceeds the read endurance threshold. This method does not take into account the access pattern of the reads in the block and can result in scrubbing a block more often than needed, which directly impacts the write endurance count of the memory. Memory read disturb specifications are typically in terms of number of reads allowed per page. With the block counter the system has no way to tell the physical location of the read stress within the block, so it has to be limited by the worst case, which leads to potential over-scrubbing. Another possible drawback of this method is that it does not consider the difference between open block (where a block is less than fully written) read disturb and closed block read disturb. Regardless of whether the block is open or closed, the counter will track the exact same way. The read endurance will be bounded by the worst case usage.

Another approach to reduce the negative effects associated with read disturbs and read scrub is a reduction in the control gate bias level on word lines neighboring a selected word line. However, this approach can complicated to optimize and may have current conductivity issues for the NAND strings.

Considering read disturb further, this is one of the major reliability issues of NAND memory system. It is the phenomenon that read stress is induced not only on the current word line being read but also affects the immediate unread neighbors and other distant word lines within the same physical block. Usually the immediate word lines n−1 and n+1 get affected the most. Read stress can be applied to NAND memory blocks under various scenarios: 1) read stress to the boundary between written and unwritten word lines in open blocks; 2) to the closed word lines (non-boundary and written word lines) in open blocks 3) to closed blocks; and 4) can also happen at the different life stage of the device. Under the different circumstances, it will cause different amount of read disturbance. For example, the failure bit rates between open versus closed blocks or between boundary and non-boundary word lines in an open block can differ by a factor of 10 or more.

An accurate assessment of read disturbance is important for a read scrub algorithm. The read counter management schemes below targets such accurate evaluation of read disturbance. The presented read scrub schemes employ adaptive read counters that distinguish boundary word line read disturb from other types, that adapts to before and after block closure with a de-rating factor, and that also adapt to different device life stage in terms of program/erase (PIE) cycles.

Boundary Word Line Counter Vs. Cumulative Word Line Counter

Word lines are typically written sequentially starting from one end, such as with the source end with WL0 in FIG. 6, and working through to WL$n$ on the drain side. As such, a partially written, or open, block will have a boundary word line, or word lines, as the last written word line (or set of word lines) in the sequence. Non-written word lines are disturbed by the memory reading the written word lines in the same open blocks. For boundary word lines, Yupin effect is not fully established before the next word line gets programmed. These boundary word lines may show worse condition (in terms of erased to lowest state, Er→A, disturb) than other word lines in the block. It can thus be useful to distinguish the boundary word line read stress. Moreover, as device sizes shrink, they are often more prone to failures due to the combined effect of RD (read disturb) and then PD (program disturb) in open blocks.

To identify the risky block and flag them for read scrub relocation in time, a first embodiment introduces boundary word line (WL) and cumulative WL counters (Firmware based counters) for open blocks to track the read stress and verify against the thresholds to determine when to copy the data to a new block. These counters can be firmware based and maintained by the controller in RAM, non-volatile memory, or some combination of these. For example, the firmware can create a structure for the read counts, with portions of these being saved in SRAM or DRAM while power is on and the counts also being periodically flushed to the NAND memory. The two counters can be bounded by different RD thresholds, such as can be based on device qualification data. The boundary WL counter is the special moving counter for the open/boundary word lines and cumulative WL counter tracks overall reads fall into the open block.

Figure 13:
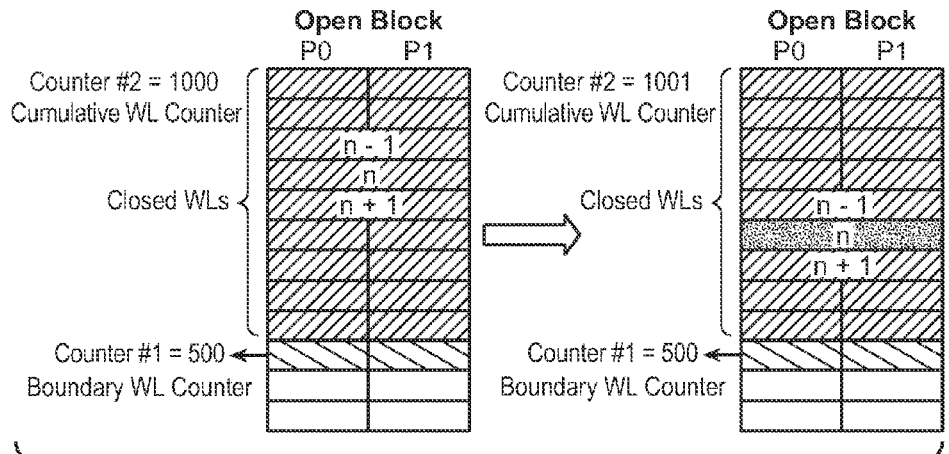
FIG. 13 looks at a read on a closed word away from the boundary of an open block.
Figure 14:
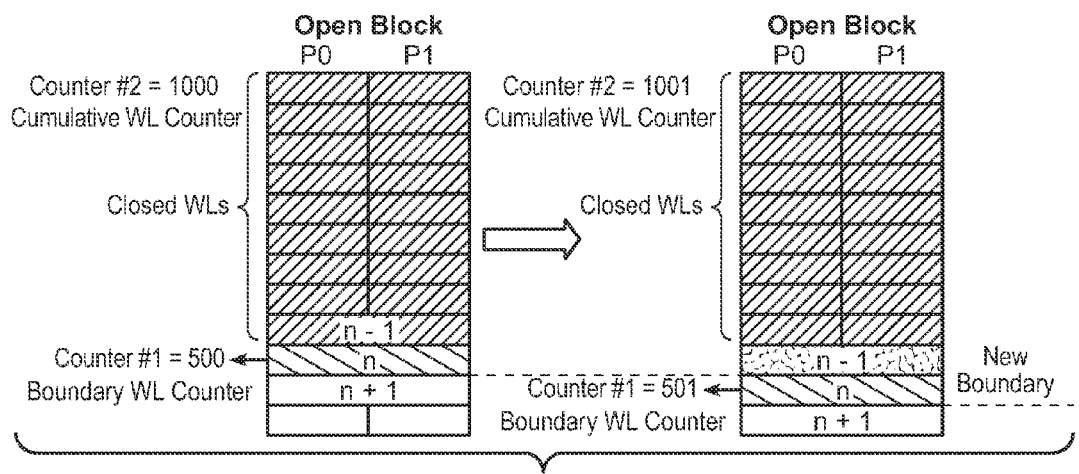
FIG. 14 shows an example of a read on the new boundary word line of an open block.
Figure 15:
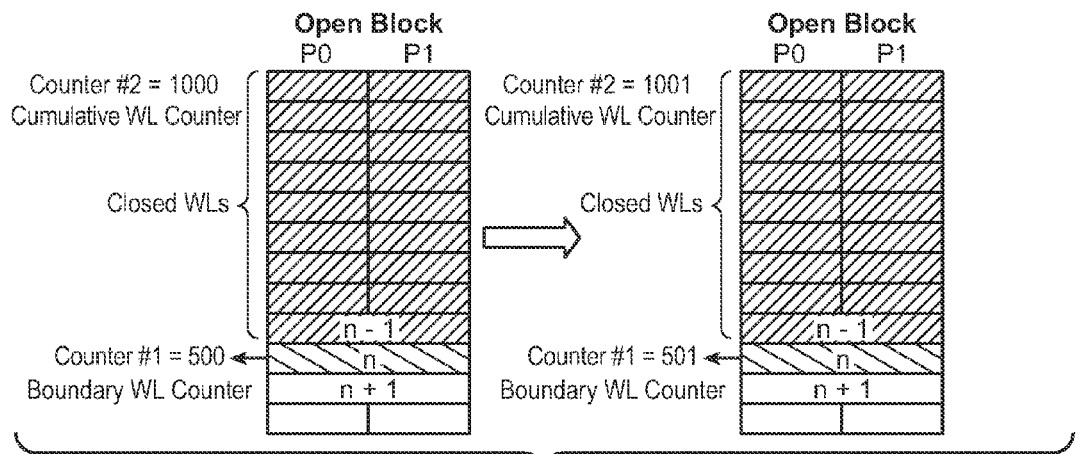
FIG. 15 shows an example of a read on the same boundary word line of an open block.

FIGS. 13-15 illustrate an example of how the counters in an open block are allocated and tracked (n is the word line currently being read; n−1 is the previous word line and n+1 is the next). The word lines with the hatching are written, the clear word lines unwritten, and the boundary is shown with lighter hatching. (In these figures, a die has two planes, P0 and P1, for the same die along the same word line, but this just a particular embodiment.) FIG. 13 looks at a read on a closed word away from the boundary of an open block. As the read is on one of the closed word lines, the cumulative count for all word line reads of Counter #2 is incremented from, in this example, 1000 to 1001. As the read is not on the boundary, the boundary counter Counter #2 stays the same.

For the reads that stress the boundary word lines in the open block, the exemplary embodiment uses a moving counter to track the number of boundary word line reads because an open block can be written to, so that the boundary word lines in open blocks can change. To take care of a relatively worse case, the moving counter can keep incrementing if any read hits what is, at the time of the read, the boundary word line. The counter value can be reset after the new, de-rated threshold is determined. FIG. 14 shows an example of a read on the new boundary word line of an open block. Initially, as shown on left of FIG. 14, the boundary and cumulative counter values are respectively Counter #1=500 and Counter #2=1000. A page (or pages) of data is then written, so that the boundary moves down one word line, so that what was the unwritten labelled as n+1 on the left is now the boundary word linen on the right. The new boundary word line is then read, so both the boundary and cumulative counters are incremented to Counter #1=501 and Counter #2=1001. FIG. 15 is again a boundary read, so that both counters are again incremented, but the boundary word line has not moved and is at the same location of the open block.

An open block read refresh can then be triggered by either of the following two conditions:

a. If boundary WL read count>Boundary WL RD threshold;

b. If cumulative WL read count>Cumulative WL RD threshold.

The two counts have different thresholds, where these the values can be fixed or variable, such described below for the case where the thresholds vary based on a block's number of program/erase cycles. If a block is flagged for read scrub copy, the block relocation will be scheduled. After the block relocation, the risky block will be erased and the block erase will reset the counter values.

A number of variations are possible for this arrangement. For example, rather than reset a block's boundary counter at erase and let it accumulate without resetting as the boundary moves, the boundary counter can be reset after some or all of the times that the boundary moves, where the threshold or threshold set accordingly. This approach can focus more on the individual word lines while they are at the boundary, but may also trigger relatively frequent relocations.

The definition of the boundary can also be broader than the last written word line and include a set of word lines in the near neighborhood of the last written word line. For differing types of memory configurations (both in terms of structures and the number of states per cell), the definition of the boundary—and the number of pages involved—will vary. When the boundary counter is more general than for just the written last word line in the write sequence, a weighting can be applied based on the different type of boundaries: for example, the "last word line minus 1" could be weighted less than the last word line.

The counter for the cumulative number of reads to the block can also be generalized to the case when the word lines of a block are subdivided into a number of zones of contiguous word lines. For example, in addition to the special treatment for the boundary word lines, the system can use more than one counter for the block's cumulative counts. For example, a block can be divided in to multiple zones, each with its own cumulative counter: for example, one counter would track the cumulative number of reads for word lines 0-31, a second counter could track word lines 32-63, and so on, with the last couple of word lines or pages tracked by the boundary counter.

Figure 16:
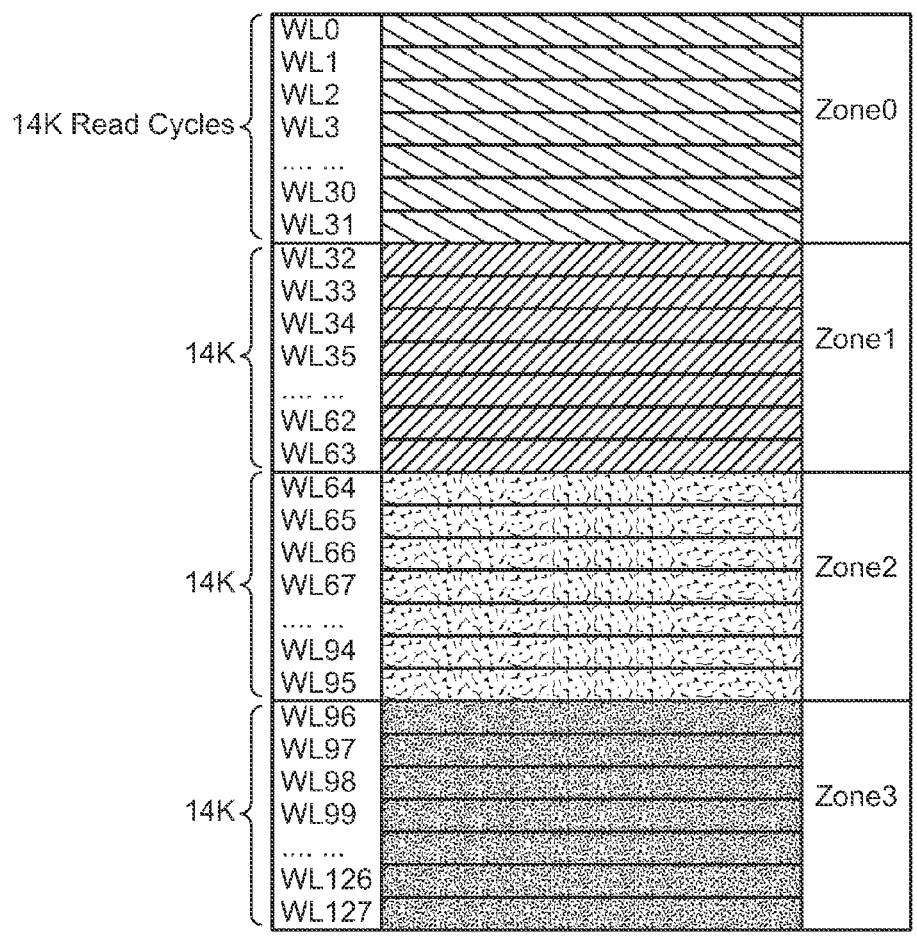
FIG. 16 illustrates the use of counter with a zone structure.

FIG. 16 illustrates the use of counter with a zone structure. The block is divided into a number of zones, where 4 are shown in this example, and a zone read cycle count can be maintained for each zone. The number of zones can be fixed or parameterized. Within each zone, the read count can be increased when the reads stress any word line of the zone (for single WL stress, the counter will be incremented every time it hits the word line), with the scrubbing decision based on if the read cycle count of the zone reaches the corresponding threshold.

Multi-Stage Read Disturb Specification Vs. P/E Cycle

Figure 17:
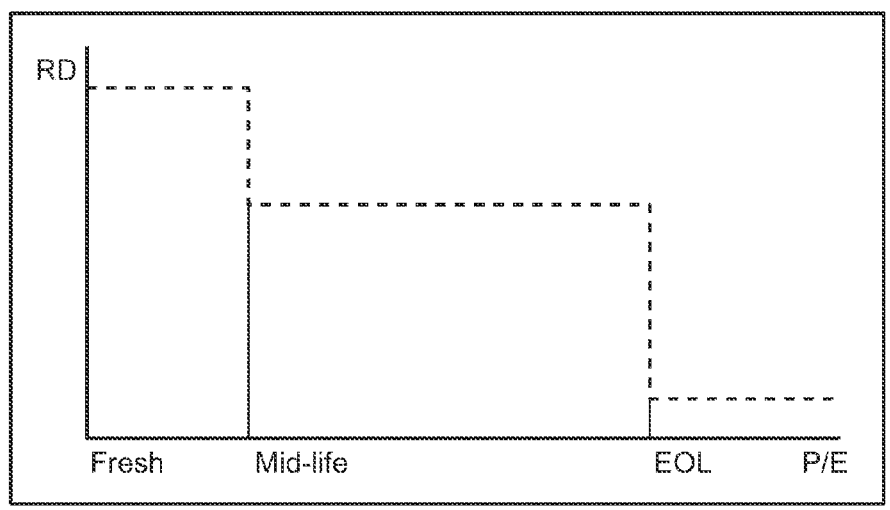
FIG. 17 illustrates a three stage read disturb threshold arrangement, where for each of the ranges a different threshold level is used.

At the different stages of device's life (such as can be measured in terms of program/erase, or P/E, cycles), the read disturb specification can also vary. While the device is fresh, the read disturbance specification is generally higher, while as it is cycled more, the read disturb situation becomes worse. FIG. 17 illustrates a three stage read disturb threshold arrangement, where for each of the ranges a different threshold level is used. Table 1 shows an example of a read disturb (RD) threshold vs. program/erase (P/E) lookup table. This arrangement can also incorporate an adaptive trim mechanism to better use the memory's read endurance, where, at run time, each block can have its own different read disturb threshold depending on the particular trim set. Allowing for the different blocks to use different trimming can allow for a prolonged lifetime.

TABLE 1

|  | Cumulative WL Thresholds RD | Boundary WL Thresholds RD |
| --- | --- | --- |
| Fresh (BOL) | 100K | 60K |
| Mid-Life (MOL) | 80K | 50K |
| End of Life (EOL) | 50K | 30K |

Read Disturb De-Rating Factor

A first source of data degradation is read disturb, where the erased distribution is shifted to higher threshold voltages after many reads. A second source of data degradation is cell-to-cell interference, where programming one cell will cause its neighbor cell's threshold voltage to shift up. While both sources contribute to the erased distribution shifting higher, the order in which these two operations occur is important. Generally speaking, if read disturb occurs first, the net effect is larger. However, if cell-to-cell interference occurs first, the net effect is smaller.

This phenomenon can result in read disturb before block closure leading to worse data degradation. When read disturb occurs on cells that have yet to be programmed, the net effect after cell-to-cell interference from programming is worse. When read disturb occurs after the entire block has been programmed, then the memory does not suffer more cell-to-cell interference thereafter.

A technique for dealing with this is a "de-rating factor" between the allowed read disturb level before and after block closure. Effectively, it weights the read disturb before block closure more heavily (i.e. more detrimental to data integrity) relative to read disturb after block closure. Moreover, for open block there can be a de-rating factor existing for when firmware performs multiple reads between multiple writes.

Depending on the memory's quality data, such as can be obtained during device characterization, the memory system can use full read endurance specification as the maximum threshold for the counter or de-rate the read counter to be lower number. Upon block closure, for different memory types different thresholds can be set as the condition for triggering read scrub relocation. The way of read counter tracking will be similar to the open block counters. For memory devices storing data in different formats, such as binary and multi-state, different read disturb thresholds can be used.

Table 2 gives an example of some values for setting the threshold to the cumulative word line threshold of open block with some de-rating factor. The de-rating factor for different cumulative counts at closure can be based on device characterization data and kept as a look-up table, as in the example Table 2. If the cumulative word line count of the block reaches 90K, it will be scheduled for refresh.

TABLE 2

| Cumulative WL counts upon block closure | De-rating Factor |
| --- | --- |
| <50K | 1 |
| <60K | 2 |
| <70K | 3 |
| <80K | 4 |
| <90K | 5 |

In the example of Table 2, the de-rating factor is only dependent upon the cumulative open block read count, but this can also be a function of the boundary count or some combination of the two counts, such as a of the cumulative count and some weighting factor based on the boundary count. In other embodiments, different ranges, and differing numbers of ranges, can be used.

Figure 18:
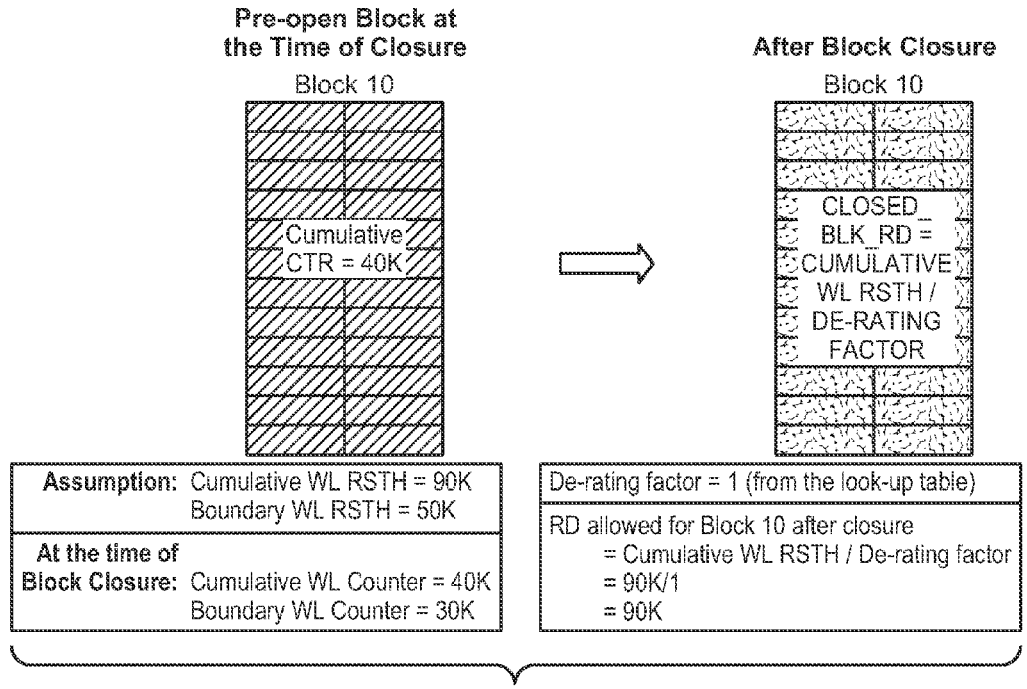
FIGS. 18 and 19 are two examples to illustrate how the de-rating factors can be applied.
Figure 19:
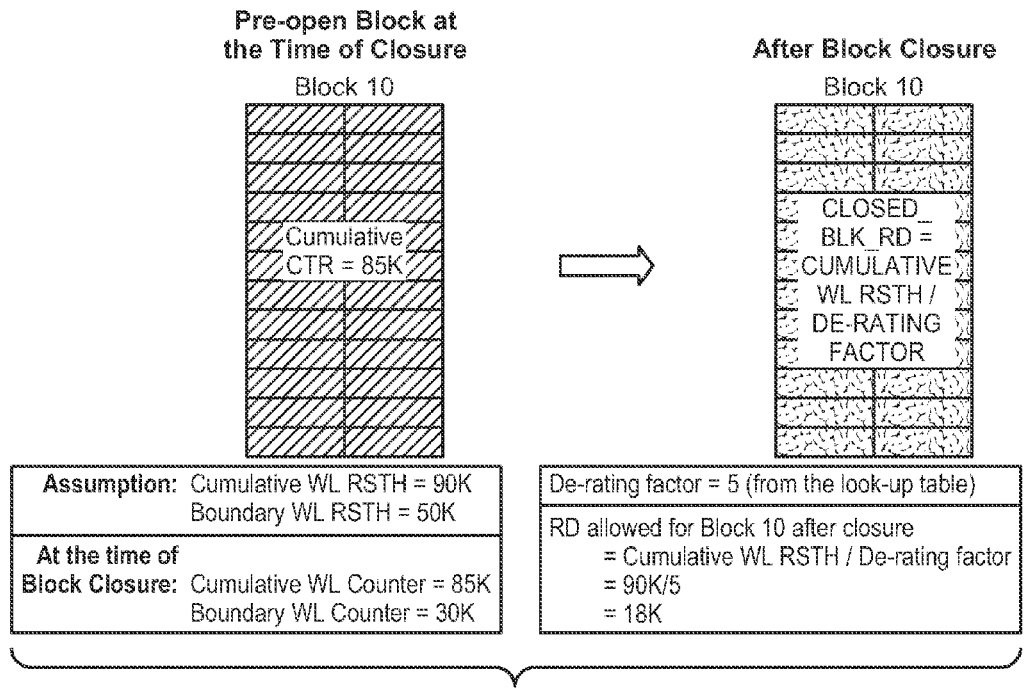

FIGS. 18 and 19 are two examples to illustrate how the de-rating factors can be applied. In FIG. 18, at the cumulative and boundary read scrub thresholds are respectively 90K and 50K. At the time of closure the cumulative and boundary counts are respectively 40K and 30K, so that using the look-up table of Table 2, the de-rating factor is 1. Consequently, the number of reads allowed after closure is 90K/1=90K. In the example of FIG. 19, the read scrub thresholds are the same, but the respective cumulative and boundary counts are 85K and 30K. This corresponds to a de-rating factor of 5, so that the threshold after closure is 90K/5=18K.

Figure 20:
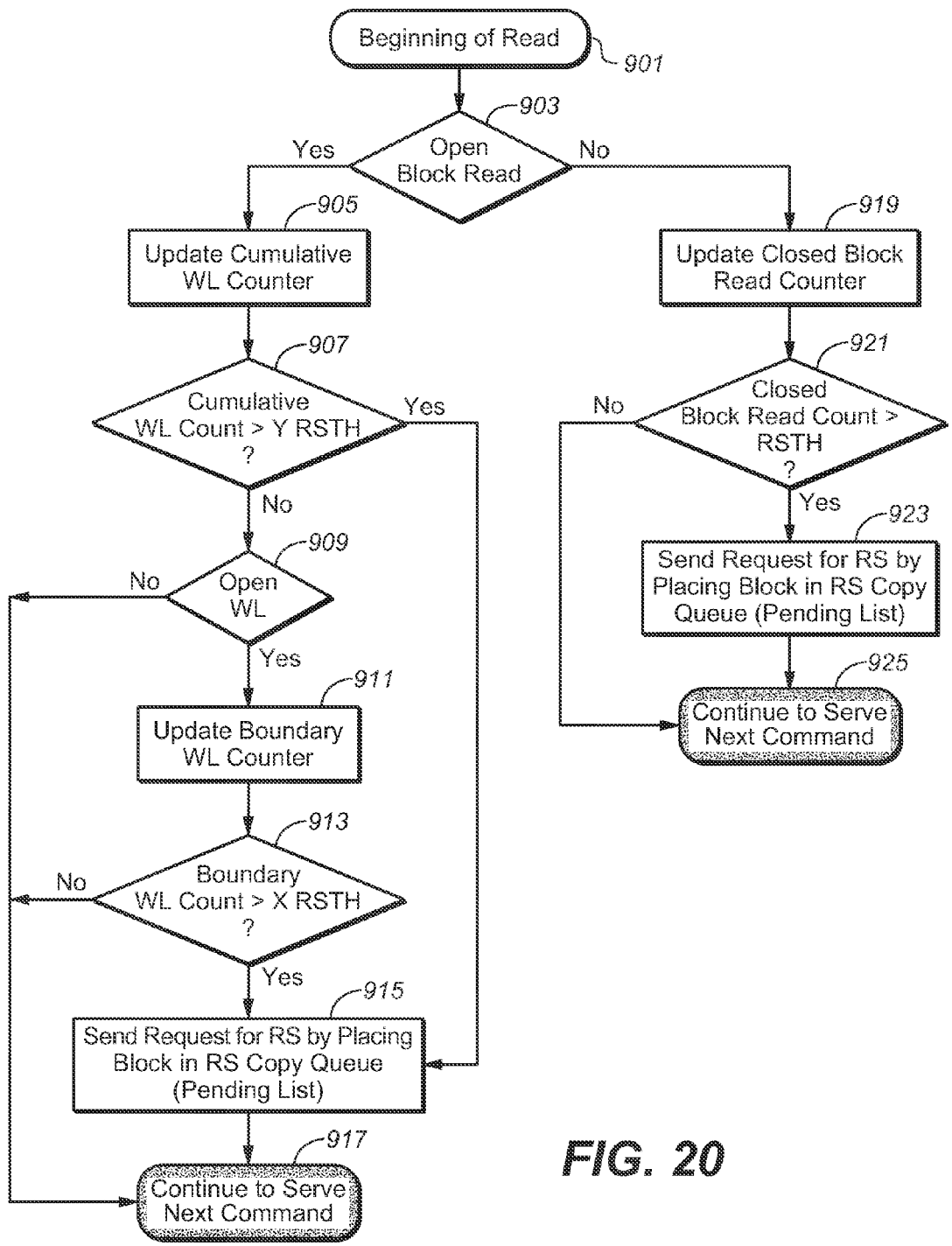
FIG. 20 is a general flow for open and closed block read.

FIG. 20 is an example of a general flow for open and closed block reads. Starting at 901, the read can be of any sort, such as host read, an internal control read, dynamic reads, read scrub read scans, and so on. It is then determined (903) if the read is to an open block and, if so, the cumulative word line counter is updated at 905. The cumulative word line count is checked at 907 to see if the cumulative number of read cycle counts has reached the set threshold (RSTH) for cumulative reads in an open block: if so, the flow jumps to 915; if not, it is determined whether the word line is open or not at 909. If the word line is not open, the flow can skip to 917, but for an open word line, the boundary counter is incremented at 911.

The incremented boundary count is checked at 913 to see whether this moving counter value has reached the corresponding read scrub threshold for open blocks. If not, the flow skips ahead to 917. If the threshold for either of 907 or 913 is reached, a request for a read scrub is sent at 915 by placing the block in the pending list of the read scrub queue. For any of the paths to 917, the memory then continues on to serve the next command.

Going back to 903, if the read is for a closed block, at 914 the closed block read counter is updated and checked against the corresponding threshold at 921. Different devices can have differing thresholds, including the de-rating factor, and a block's threshold can also depend on the number of program/erase cycles in manner described above. If below the threshold, the flow jumps to 925, while if the incremented count has reached the threshold at 913 the block is placed on the read scrub queue before going to 925 and continuing to serve the next command.

CONCLUSION

The foregoing techniques allow for the memory system to distinguish the read disturb specification difference between the open and closed blocks, without which it would have to assume that every block had been read-disturbed some number of times before the block was closed. With this technique, the read disturb counter threshold can adapt accordingly based on the de-rated factor. Hence, if a block had not been read at all when it was open, the arrangement allows it to be read many more times before being queued for read scrubbing. Further, the techniques allow for different read disturb thresholds for different word lines in the same block and do not need to follow the worst word line.

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A method, comprising:
for a non-volatile memory circuit having a plurality of blocks formed according to a NAND type architecture in which memory cells of a block are formed along a plurality of word lines and in which the word lines of a block are written in sequence from a first end to a second end thereof, maintaining, for blocks in which one or more but less than all of the word lines have been written, first and second read counts, where the first read count tracks the cumulative number of reads for all word lines of the corresponding block, where the second read count tracks the cumulative number of reads to one or more of the last word lines in the write sequence of the corresponding block that is written at the time at which the read is performed, and wherein the first and second read counts are reset after an erase operation to the corresponding block; and
in response to either of the first or second read counts of a block reaching a respective first or second count threshold, marking the corresponding block for a data relocation operation.

2. The method of claim 1, wherein the second read count tracks the cumulative number of reads to the last word line in the write sequence of the corresponding block that is written at the time at which the read is performed.

3. The method of claim 2, further comprising:
maintaining for each of the blocks an experience count tracking the number program-erase cycles that the block has undergone, wherein one or both of the first and second count threshold values of a block vary with the block's experience count.

4. The method of claim 2, further comprising:
subsequently rewriting the data content of the block marked for a data relocation operation to a different block.

5. The method of claim 2, wherein the non-volatile memory circuit is part of a memory system further including a controller circuit, wherein the first and second read counts are maintained by the controller.

6. The method of claim 2, wherein the memory cells of the non-volatile memory circuit are arranged in a two-dimensional array.

7. The method of claim 2, wherein the non-volatile memory circuit is a monolithic three-dimensional semiconductor memory device where the memory cells are arranged in multiple physical levels above a silicon substrate and comprise a charge storage medium.

8. The method of claim 2, further comprising:
resetting the second read count in response to one or more word lines of the corresponding block being written.

9. The method of claim 1, wherein the second read count weights the contribution to the count from different ones of the one or more of the last word lines in the write sequence of the corresponding block that is written at the time at which the read is performed based upon proximity to the last of the last word line in the write sequence at the time at which the read is performed.

10. A non-volatile memory system, comprising:
a non-volatile memory circuit having a plurality of blocks formed according to a NAND type architecture in which memory cells of a block are formed along a plurality of word lines; and
a controller connected to the non-volatile memory circuit to manage the storage of data thereon,
wherein in writing data to a block of the non-volatile memory circuit word lines are written in sequence from a first end to a second end thereof, and
wherein the controller maintains, for blocks in which one or more but less than all of the word lines have been written, first and second read counts, where the first read count tracks the cumulative number of reads for all word lines of the corresponding block, where the second read count tracks the cumulative number of reads to one or more of the last word lines in the write sequence of the corresponding block that is written at the time at which the read is performed, and wherein the first and second read counts are reset after an erase operation to the corresponding block; and
in response to either of the first or second read counts of a block reaching a respective first or second count threshold, the controller marks the corresponding block for a data relocation operation.

11. The non-volatile memory system of claim 10, wherein the second read count tracks the cumulative number of reads to the last word line in the write sequence of the corresponding block that is written at the time at which the read is performed.

12. The non-volatile memory system of claim 11, wherein the controller maintains for each of the blocks an experience count tracking the number program-erase cycles that the block has undergone, wherein one or both of the first and second count threshold values of a block vary with the block's experience count.

13. The non-volatile memory system of claim 11, wherein the controller subsequently rewrites the data content of the block marked for a data relocation operation to a different block.

14. The non-volatile memory system of claim 11, wherein the memory cells of the non-volatile memory circuit are arranged in a two-dimensional array.

15. The non-volatile memory system of claim 11, wherein the non-volatile memory circuit is a monolithic three-dimensional semiconductor memory device where the memory cells are arranged in multiple physical levels above a silicon substrate and comprise a charge storage medium.

16. A non-volatile memory controller, comprising:
RAM memory; and
logic circuitry configured to manage the storage of data on a non-volatile memory circuit having a plurality of blocks formed according to a NAND type architecture in which memory cells of a block are formed along a plurality of word lines, wherein in writing data to a block of the non-volatile memory circuit word lines are written in sequence from a first end to a second end thereof, wherein managing the storage of data on the non-volatile memory circuit includes:
maintaining, for blocks in which one or more but less than all of the word lines have been written, first and second read counts, where the first read count tracks the cumulative number of reads for all word lines of the corresponding block, where the second read count tracks the cumulative number of reads to one or more of the last word lines in the write sequence of the corresponding block that is written at the time at which the read is performed, and wherein the first and second read counts are reset after an erase operation to the corresponding block; and
in response to either of the first or second read counts of a block reaching a respective first or second count threshold, marking the corresponding block for a data relocation operation.

17. The non-volatile memory controller of claim 16, wherein the second read count tracks the cumulative number of reads to the last word line in the write sequence of the corresponding block that is written at the time at which the read is performed.

18. The non-volatile memory controller of claim 17, wherein the controller maintains for each of the blocks an experience count tracking the number program-erase cycles that the block has undergone, wherein one or both of the first and second count threshold values of a block vary with the block's experience count.

19. The non-volatile memory controller of claim 17, wherein the controller subsequently rewrites the data content of the block marked for a data relocation operation to a different block.

20. The non-volatile memory controller of claim 17, wherein the non-volatile memory circuit is a monolithic three-dimensional semiconductor memory device where the memory cells are arranged in multiple physical levels above a silicon substrate and comprise a charge storage medium.

* * * * *